(12) United States Patent
Liu et al.

(10) Patent No.: US 10,703,022 B2
(45) Date of Patent: *Jul. 7, 2020

(54) 3D PROCESSING DEVICE AND METHOD THEREOF

(71) Applicant: NANCHANG O-FILM OPTICAL TECHNOLOGY CO., LTD, Nanchang (CN)

(72) Inventors: Wei Liu, Nanchang (CN); Genchu Tang, Nanchang (CN); Bin Tang, Nanchang (CN)

(73) Assignee: NANCHANG O-FILM OPTICAL TECHNOLOGY CO., LTD, Nanchang (CN)

( * ) Notice: Subject to any disclaimer, the term of this patent is extended or adjusted under 35 U.S.C. 154(b) by 431 days.

This patent is subject to a terminal disclaimer.

(21) Appl. No.: 15/600,726

(22) Filed: May 20, 2017

(65) Prior Publication Data

US 2018/0079143 A1    Mar. 22, 2018

(30) Foreign Application Priority Data

Sep. 22, 2016  (CN) .......................... 2016 1 0841353

(51) Int. Cl.
| | |
|---|---|
| B29C 33/30 | (2006.01) |
| B32B 37/06 | (2006.01) |
| B32B 37/00 | (2006.01) |
| H01L 21/00 | (2006.01) |
| B29C 33/00 | (2006.01) |
| B29C 33/02 | (2006.01) |
| B29C 33/04 | (2006.01) |

(Continued)

(52) U.S. Cl.
CPC ........ *B29C 33/301* (2013.01); *B29C 33/0088* (2013.01); *B29C 33/02* (2013.01); *B29C 33/046* (2013.01); *B29C 33/302* (2013.01); *B29C 43/021* (2013.01); *B29C 66/301* (2013.01); *B32B 37/00* (2013.01); *B32B 37/06* (2013.01); *H01L 21/00* (2013.01); *B29C 66/00143* (2013.01); *B29C 66/02* (2013.01); *C08J 5/121* (2013.01)

(58) Field of Classification Search
CPC ..... B29C 63/182; B29C 65/44; B29C 33/301; B29C 33/02; B29C 33/302; B29C 33/0088; B32B 37/10; B30B 5/02; B30B 9/22

See application file for complete search history.

(56) References Cited

U.S. PATENT DOCUMENTS

| | | | | |
|---|---|---|---|---|
| 5,151,277 A | * | 9/1992 | Bernardon | ............ B29C 33/302 |
| | | | | 249/155 |
| 2012/0247664 A1 | * | 10/2012 | Kobayashi | .............. H01L 24/75 |
| | | | | 156/285 |
| 2014/0367027 A1 | * | 12/2014 | Roh | ..................... C03B 23/0302 |
| | | | | 156/99 |

\* cited by examiner

*Primary Examiner* — Christopher T Schatz
(74) *Attorney, Agent, or Firm* — Franklin & Associates International Inc; Matthew Lambrinos

(57) ABSTRACT

A device for attaching a decorative film to a surface of a 3D glass, includes a vacuum chamber, an upper mould, and a lower mould. The upper mould includes an upper planar pressing portion and an upper curved portion. The lower mould includes a lower planar pressing portion and a lower curved portion, the upper planar pressing portion and the lower planar pressing portion are configured to correspond to a planar portion of the 3D glass, the upper curved portion and the lower curved portion are configured to correspond to a curved portion of the 3D glass, the upper mould is (Continued)

provided with a first heating block. The present disclosure further discloses a method thereof.

7 Claims, 2 Drawing Sheets

(51) Int. Cl.
*B29C 43/02* (2006.01)
*B29C 65/00* (2006.01)
*C08J 5/12* (2006.01)

3D PROCESSING DEVICE AND METHOD THEREOF

CROSS REFERENCE TO RELATED APPLICATION

This application claims priority under 35 U.S.C. § 119 to Chinese Patent Application No. 201610841353.3, filed on Sep. 22, 2016. The entire teachings of the above application are incorporated herein by reference.

FIELD OF THE INVENTION

The present disclosure relates to electronic devices, and more particularly, relates to a device and a method for processing a decorative film on a 3D glass which is served as a housing of an electronic product.

BACKGROUND OF THE INVENTION

With the development of electronic devices such as smart phone and smart watch, which are provided with a touch screen, various manufacturers are scrambled to launch differentiated devices, hoping to attract consumers. A highlight design emerged in the current market is that, the housing of the electronic device is configured to have a curved housing, i.e. the surface of the housing is no longer a flat surface, but a 3D stereoscopic curved surface. The electronic device having a curved housing can fit the hand of the user better, providing a comfortable sensation for holding and handling the electronic device. If the watch housing is configured to be a curved housing, it can fit the wrist of the user better, providing a comfortable sensation for wearing the watch. Furthermore, when a display housing having the curved configuration, the displaying content displayed on the display can have an intense stereoscopic impression, and a perception can thereby be improved. Because glass has a better tactile sensation, when it serves as the materials of the housing of the electronic device, the electronic device meets a great favor. The traditional method for attaching a decorative film to the planar glass is a rolling processing method or a gas bag processing method. However, the method cannot be applied to attach a decorative film to a 3D glass. Aforementioned processing method causes a wrinkle of the decorative film on the surface edges of the 3D glass, thereby affecting the processing effect of the 3D glass.

SUMMARY

Accordingly, it is necessary to provide a 3D processing device and a method, which address the problems emerging in attaching a decorative film to a surface of a 3D glass surface.

A device for attaching a decorative film to a surface of a 3D glass, includes: a vacuum chamber; an upper mould located in the vacuum chamber, wherein the upper mould includes an upper planar pressing portion and an upper curved portion on an edge of the upper planar pressing portion; a lower mould located in the vacuum chamber. wherein the lower mould includes a lower planar pressing portion and a lower curved portion on an edge of the lower planar pressing portion; wherein the upper planar pressing portion and the lower planar pressing portion are configured to correspond to a planar portion of the 3D glass, the upper curved portion and the lower curved portion are configured to correspond to a curved portion of the 3D glass, the upper mould is provided with a first heating block for heating the decorative film.

A method for processing decorative film for a 3D glass decorative film, includes: providing a sealing chamber having an upper mould and a lower mould therein, wherein the upper mould and the lower mould have surfaces matching a shape of a surface of the 3D glass, and the upper mould is provided with a first heating block; positioning the 3D glass and the decorative film between the upper mould and the lower mould, and evacuating the sealing chamber; heating the upper mould by the first heating block, softening the decorative film when the upper mould contacts the decorative film; and engaging the upper mould and the lower mould, thereby attaching the decorative film to a surface of the 3D glass.

In the present disclosure, when the decorative film are pressed under a heating environment and high pressure simultaneously, the decorative film is made softer and is deformed, thus an attachment between the 3D glass and the decorative film can be better, avoiding a twining of the decorative film in the attaching process, which is due to a particular shape.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE EMBODIMENTS

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

Figure 1:
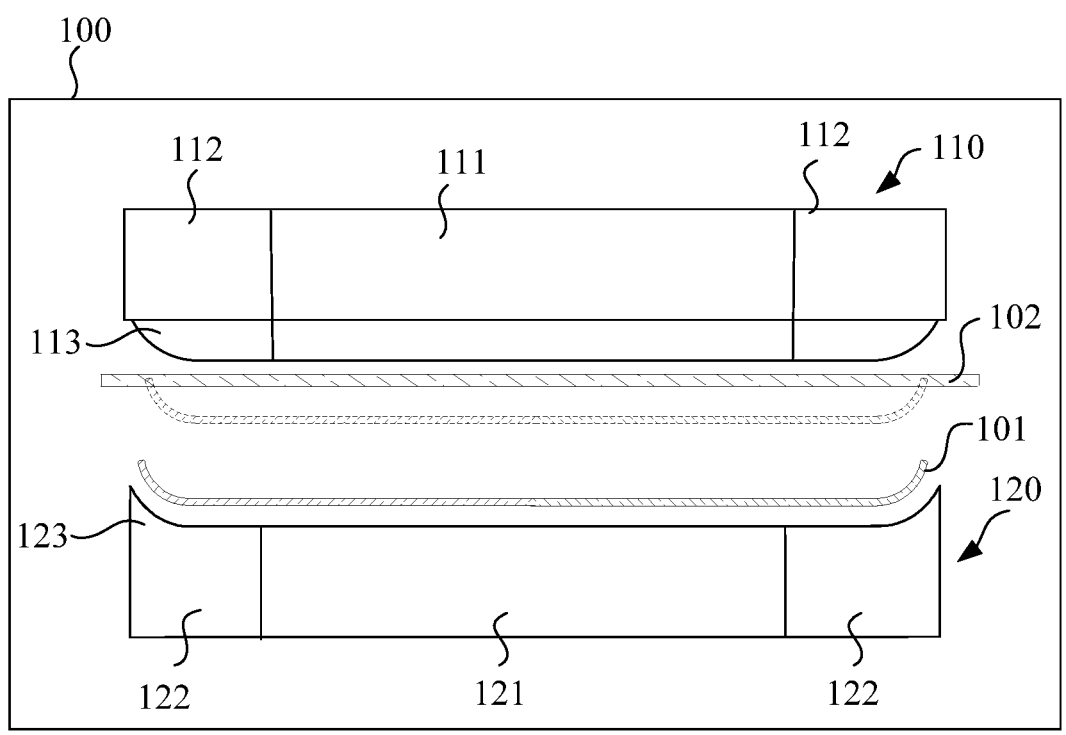
FIG. 1 is schematic view of a 3D processing device according to an embodiment.
Figure 2:
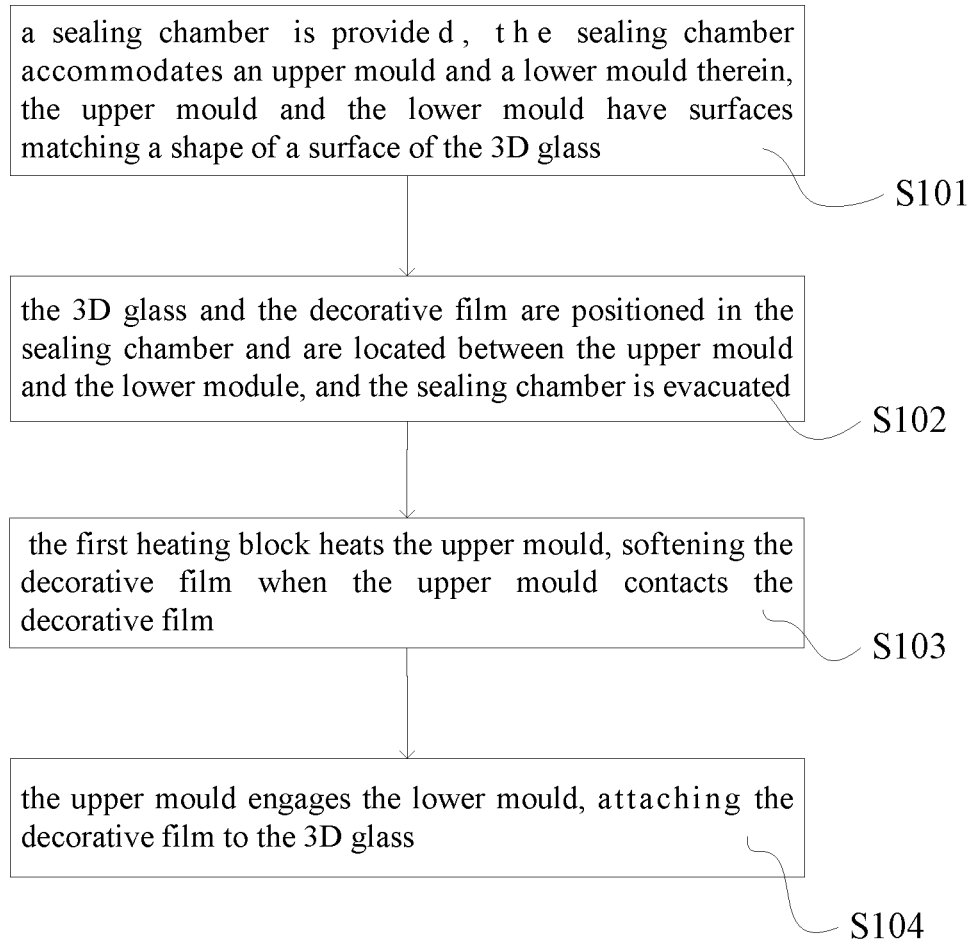
FIG. 2 is a flowchart of a 3D glass decorative film processing method.

As shown in FIG. 1, a 3D decorative film processing device according to an embodiment of the present disclosure is provided. The 3D decorative film processing device includes a sealing chamber 100, an upper mould 110 and a lower mould 120 which are disposed within the sealing chamber 100. An evacuation treatment can be performed to the sealing chamber 100, thereby a vacuum or similar vacuum environment can be formed in the sealing chamber 100. Opposite surfaces of the upper mould 110 and the lower mould 120 have shapes matching the surfaces of the 3D glass 101 to be processed. When the upper mould 110 engages the lower mould 120, the upper mould 110 can adjoin a surface of a side of the 3D glass 101 seamlessly, the lower mould 120 can adjoin a surface of an opposite side of the 3D glass 101 seamlessly. It can be understood that, in the machining process of the processing device, the upper mould 110 and the lower mould 120 are configured to attach the decorative film 102 to the 3D glass 101. Therefore, in an embodiment, the upper mould 110 is adjacent to the 3D glass 101, the lower mould 120 is adjacent to the decorative film 102. When the upper mould 110 engages the lower mould 120, the decorative film 102 is pressed and attached to a surface of the 3D glass 101.

The upper mould 110 includes an upper planar pressing portion 111 and an upper curved portion 112 on an edge of the upper planar pressing portion 111. According to an embodiment, the upper planar pressing portion 111 and the upper curved portion 112 are independently configured, i.e. the upper planar pressing portion 111 can move relative to the upper curved portion 112, or the upper planar pressing portion 111 can be disassembled from the upper curved portion 112. A number of the upper curved portion 112 can be two, which are respectively corresponding to opposite edges of the upper planar pressing portion 111. In other alternative embodiment, a number of the upper curved portion 112 can also be four, which are respectively corresponding to peripheral edges of the upper planar pressing portion 111. It can be understood that these upper curved portions 112 can also be integrally formed. The upper planar pressing portion 111 corresponds to a planar portion of the 3D glass 101, the upper curved portions 112 corresponds to a curved portion of the 3D glass 101.

The upper mould 110 can be provided with a first heating block 113 for heating the decorative film 102. In an alternative embodiment, the first heating block 113 is located at the upper curved portion 112, the first heating block 113 heats the upper curved portion 112. When the processing machining works, the heat of the upper curved portion 112 can be transferred to the decorative film 102, so as to make the decorative film 102 softer (as shown in the dash line in FIG. 1), such that the shape of the decorative film 102 can match the shape of the surface of the 3D glass.

Further, the first heating block 113 is also located on the upper planar pressing portion 111, thus heating the whole upper mould 110, such that the heat will be transferred to the whole decorative film 102, thus the decorative will be made softer and deformed.

The lower mould 120 includes a lower planar pressing portion 121 and a lower curved portion 122 on an edge of the lower planar pressing portion 121. The lower curved portion 122 is configured to correspond to a curved portion of the 3D glass 101. The lower planar pressing portion 121 is configured to correspond to a planar portion of the 3D glass 101.

In alternative embodiment, the lower planar pressing portion 121 and lower curved portion 122 are independently arranged. Further, the lower curved portion 122 can be provided with a second heating block 123, which is configured to heat the 3D glass 101. By heating the 3D glass 101 and the decorative film 102 simultaneously, a temperature difference between the 3D glass 101 and the decorative film 102 can be reduced, and a better attachment effect can be attained.

Further, the second heating block 123 is located on the lower planar pressing portion 121, which is configured to heat the 3D glass 101.

The present disclosure further provides a method for attaching a decorative film for a 3D glass, the method includes the following steps:

In step S101, a sealing chamber 100 is provided. The sealing chamber accommodates an upper mould 110 and a lower mould 120 therein, the upper mould 110 and the lower mould 120 have surfaces matching a shape of a surface of the 3D glass 101.

In step S102, the 3D glass 101 and the decorative film 102 are positioned in the sealing chamber 100 and are located between the upper mould 110 and the lower mould 120, and the sealing chamber 100 is evacuated. A requirement for the vacuum degree is that it can generate a negative pressure to drive the decorative film to be sucked on the upper mould 110, and the 3D glass is sucked to the lower mould 120. A higher vacuum degree is that the air between the upper mould 110 and the lower mould 120 is less when the upper mould 110 engages the lower mould 120, such that a better attachment effect between the 3D glass 101 and the decorative 120 can be obtained, and bubbles are eliminated.

In step S103, the first heating block 13 heats the upper mould 110, enabling the decorative film 102 to be softer when the upper mould 110 contacts the decorative film 102, thereby the decorative film 102 can be softer and deformed more easily, which facilitates for the attachment to the 3D glass 101.

In step S104, finally, the upper mould 110 engages the lower mould 120, causes the 3D glass and the decorative film 102 to be attached together.

In the present disclosure, when the decorative film 102 are pressed under a heating environment and high pressure simultaneously, the decorative film 102 is made safer and is deformed, thus an attachment between the 3D glass 101 and the decorative film 102 can be better, avoiding a twining of the decorative film 102, in the attaching process, which is due to a particular shape.

Further, the second heating block 123 is located on the lower mould 120, when the first heating block 113 heats the upper mould 110, the second heating block 123 heats the lower module 120 simultaneously. That is, the upper mould 110 and the lower mould 120 are heated simultaneously, i.e. the 3D glass 101 and the decorative film 102 are heated together, which causes a temperature difference between the 3D glass 101 and the decorative film 102 to be reduced, and a better attachment effect can be attained.

In an alternative embodiment, the upper mould 110 can be configured to have an independent upper planar pressing portion 111 and an independent upper curved portion 112. The first heating block 113 is positioned on the upper curved portion 112 for heating the upper curved portion 112. Similarly, the lower mould 120 can be configured to have an independent lower planar pressing portion 122 and an independent lower curved portion 122. The second heating block 123 is positioned on the lower curved portion 122 for heating the lower curved portion 122. In other embodiments, a heating may be performed to the whole 3D glass 101 and the decorative film 102, i.e. the upper planar pressing portion 111 and the upper curved portion 112 are both provided with one first heating blocks 113. The second heating blocks 123 are located on the lower planar pressing portion 121 and the lower curved portion 122.

Aforementioned heating temperature can range from 50 to 100 degrees centigrade, and more particularly, the heating temperature ranges from 60 to 80 degrees centigrade. Because the heat is mainly employed to heat the decorative film 102 for making the decorative film softer and to be deformed. Therefore, the temperature of the upper mould 110 can be set to be higher than that of the lower mould 120.

Technical features of above embodiments can be combined arbitrary, for simple, any combination of every technical feature in above embodiments is not all illustrated. However, the technical features which are not contradicted to each other may fall into the scope of the specification The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A device for attaching a decorative film to a surface of a 3D glass, comprising:
   a vacuum chamber;
   an upper mould located in the vacuum chamber, wherein the upper mould comprises an upper planar pressing portion and an upper curved portion on an edge of the upper planar pressing portion, the upper planar pressing portion being configured to move relative to the upper curved portion, the upper curved portion being provided with a first heating block; and
   a lower mould located in the vacuum chamber, wherein the lower mould comprises a lower planar pressing portion and a lower curved portion on an edge of the lower planar pressing portion;
   wherein the upper planar pressing portion and the lower planar pressing portion are configured to correspond to a planar portion of the 3D glass, the upper curved portion and the lower curved portion are configured to correspond to a curved portion of the 3D glass, the first heating block being configured for heating the decorative film.

2. The device according to claim 1, wherein the upper planar pressing portion and the upper curved portion are independently arranged.

3. The device according to claim 2, wherein the upper planar pressing portion is also provided with the first heating block.

4. The device according to claim 1, wherein the lower planar pressing portion and the lower curved portion are independently arranged.

5. The device according to claim 4, wherein the lower curved portion is provided with a second heating block for heating the 3D glass.

6. The device according to claim 5, wherein the lower planar pressing portion is also provided with the second heating block for heating the 3D glass.

7. The device according to claim 1, wherein the upper curved portion includes four upper curved portions that are respectively corresponding the edge of the upper planar pressing portion.

* * * * *